(12) United States Patent
Meriö

(10) Patent No.: US 11,984,149 B2
(45) Date of Patent: May 14, 2024

(54) MEMORY RETENTION FOR RADIO DEVICE

(71) Applicant: NORDIC SEMICONDUCTOR ASA, Trondheim (NO)

(72) Inventor: Ville Meriö, Oulu (FI)

(73) Assignee: Nordic Semiconductor ASA, Trondheim (NO)

( * ) Notice: Subject to any disclaimer, the term of this patent is extended or adjusted under 35 U.S.C. 154(b) by 232 days.

(21) Appl. No.: 17/580,050

(22) Filed: Jan. 20, 2022

(65) Prior Publication Data

US 2022/0236873 A1    Jul. 28, 2022

(30) Foreign Application Priority Data

Jan. 25, 2021   (FI) ...................................... 20215081

(51) Int. Cl.
*G11C 11/406*   (2006.01)
*G06F 12/02*   (2006.01)
*H04W 52/02*   (2009.01)

(52) U.S. Cl.
CPC ...... *G11C 11/40611* (2013.01); *G06F 12/023* (2013.01); *G11C 11/40603* (2013.01); *G11C 11/40618* (2013.01); *G11C 11/40622* (2013.01); *H04W 52/0258* (2013.01); *H04W 52/028* (2013.01); *G06F 2212/1028* (2013.01); *G06F 2212/1044* (2013.01)

(58) Field of Classification Search
CPC ......... G11C 11/40611; G11C 11/40603; G11C 11/40618; G11C 11/40622; G06F 12/023; G06F 2212/1028; H04W 52/0258

USPC ......................................................... 365/222
See application file for complete search history.

(56) References Cited

U.S. PATENT DOCUMENTS

| | | | |
|---|---|---|---|
| 6,914,841 B1* | 7/2005 | Thwaite ............ | G11C 11/40611 365/205 |
| 2003/0218930 A1 | 11/2003 | Lehmann et al. | |
| 2007/0180187 A1 | 8/2007 | Olson et al. | |
| 2014/0281637 A1 | 9/2014 | Bahnsen et al. | |
| 2015/0127899 A1 | 5/2015 | Cordero et al. | |

OTHER PUBLICATIONS

Search Report for FI20215081 dated Sep. 8, 2021, one (1) page.

\* cited by examiner

*Primary Examiner* — Huan Hoang
(74) *Attorney, Agent, or Firm* — Nixon & Vanderhye PC

(57) ABSTRACT

This document discloses a solution for controlling refreshing of memory resources of a dynamic random access memory. According to an aspect, there is disclosed an apparatus for a radio device, comprising: a dynamic random access memory circuit; a memory allocator configured to allocate memory resources from the dynamic random access memory circuit and to determine unallocated memory resources; a radio modem configured to communicate with the memory allocator in order to gain memory resources from the dynamic random access memory circuit; a memory refresh circuit configured to refresh the memory resources of the dynamic random access memory circuit; and a controller configured to determine, on the basis of a state change signal received from a radio modem of the radio device, that the radio modem is in an idle state and, in response to said determining, to control the memory refresh circuit to disable said refresh of the unallocated memory resources.

20 Claims, 4 Drawing Sheets

MEMORY RETENTION FOR RADIO DEVICE

This application claims priority to FI Patent Application No. 20215081 filed Jan. 25, 2021, the entire contents of which are hereby incorporated by reference.

TECHNICAL FIELD

Various example embodiments relate to memory usage in a radio device and, in particular, managing memory retention in the radio device.

BACKGROUND

Memory retention is a mechanism for a dynamic random access memory (DRAM) circuit where memory circuits of the DRAM are 'refreshed' frequently to maintain data stored therein. The retention may include reading and rewriting the memory units with the read data, and the retention obviously consumes power.

US 2007/180187 discloses a solution for reducing power consumption of a mobile communication device (such as a cellular telephone) by disabling refreshing of unused portions of DRAM. DRAM includes multiple separately refreshable memory refresh ranges (MRRs). A memory refresh manager (MRM) within the device's operating system identifies ranges of virtual memory that will not be used during subsequent sleep mode operation. The MRM remaps virtual to physical memory space to conglomerate the physical memory pages (associated with virtual memory that will not be used) in certain MRRs such that the contents of entire MRRs need not be maintained in sleep mode of the mobile communication device. Refreshing of the certain MRRs is then disabled for the sleep mode, thereby reducing power consumption. The sleep mode is determined in response to user input, such as the user pressing a power off key. Further improvements to reduce the power consumption would be beneficial.

BRIEF DESCRIPTION

According to an aspect, there is provided the invention defined by the independent claims.

Embodiments are defined in the dependent claims. The embodiments and features, if any, described in this specification that do not fall under the scope of the independent claims are to be interpreted as examples useful for understanding various embodiments of the invention.

According to an aspect, there is provided an apparatus for a radio device, comprising: a dynamic random access memory circuit; a memory allocator configured to allocate memory resources from the dynamic random access memory circuit and to determine unallocated memory resources; a memory refresh circuit configured to refresh the memory resources of the dynamic random access memory circuit; a radio modem configured to communicate with the memory allocator in order to gain memory resources from the dynamic random access memory circuit; and a controller configured to determine, on the basis of a state change signal received from the radio modem, that the radio modem is in an idle state and, in response to said determining, to control the memory refresh circuit to disable said refresh of the unallocated memory resources.

A technical effect provided by the apparatus is that no refreshing current is applied to memory resources that are unallocated in the idle state of the radio modem. The corresponding advantage is improved reduction in power consumption of the apparatus, particularly in a state where the radio device is in an active state but the radio modem is in the idle state.

In an embodiment, the idle state comprises a radio resource connection idle mode where the radio modem has no radio connection with an access node of a cellular communication system. A corresponding technical advantage is reduced power consumption in a situation where the radio resource has no radio connection.

In an embodiment, the idle state comprises a power-save mode of a radio connection. A corresponding technical advantage is further improved power-save mode with further reductions in the power consumption.

In an embodiment, the controller is further configured to determine that the radio modem is in an active state and, in response to said determining, to control the memory refresh circuit to enable said refresh of all memory resources of the dynamic random access memory. A technical effect is provision of two modes for the memory refresh circuit: one with reduced power consumption and one where all memory resources are refreshed. Accordingly, flexibility in the refreshing can be achieved.

In an embodiment, the active state comprises a state where the radio modem is operating a radio connection.

In an embodiment, the memory resources of the dynamic random access memory are divided into a plurality of memory blocks, wherein the memory allocator is configured to allocate the memory resources in units of said memory blocks, and wherein the memory refresh circuit is configured to, under the control of the controller, to perform the disabling in units of said memory blocks such that, if a memory block has not been allocated during the idle state by the memory allocator, the refresh is disabled for all memory resources of the memory block. A corresponding technical effect is to ensure that the refreshing is disabled for only those memory blocks that contain no allocated memory resources.

In an embodiment, the memory refresh circuit is configured to control the refreshing in units of memory refresh blocks, wherein each memory refresh block comprises a plurality of said memory blocks, and wherein the controller together with the memory refresh circuit is configured to disable the refreshing for a memory refresh block only if all memory blocks of the memory refresh block are unallocated. A corresponding technical effect is that it is ensured that refreshing is not disabled for such a refresh block that has allocated memory resources. Accordingly, the power-savings can be achieved without compromising the operation of the apparatus.

In an embodiment, the controller is further configured, in response to determining that the radio modem is in the idle state, to cause the memory allocator to determine the unallocated memory resources, including memory resources released by the radio modem upon entering the idle state, and the memory refresh circuit to disable said refresh of the determined unallocated memory resources.

In an embodiment, the apparatus further comprises an application processor configured to communicate with the memory allocator in order to gain memory resources from the dynamic random access memory circuit, and wherein the controller is configured to control the memory refresh circuit to disable said refresh of the unallocated memory resources when the application processor is in an active state and has allocated memory resources in the dynamic random access memory circuit.

According to an aspect, there is provided a method for a radio device, the radio device comprising: a dynamic random access memory circuit; a memory allocator configured to allocate memory resources from the dynamic random access memory circuit and to determine unallocated memory resources; a radio modem configured to communicate with the memory allocator in order to gain memory resources from the dynamic random access memory circuit; and a memory refresh circuit configured to refresh the memory resources of the dynamic random access memory circuit, wherein the method comprises:

determining, by a controller on the basis of a state change signal received from the radio modem, that the radio modem is in an idle state; and in response to said determining, controlling by the controller the memory refresh circuit to disable said refresh of the unallocated memory resources.

In an embodiment, the idle state comprises a radio resource connection idle mode where the radio modem has no radio connection with an access node of a cellular communication system.

In an embodiment, the idle state comprises a power-save mode of a radio connection of the radio modem.

In an embodiment, the controller further determines that the radio modem is in an active state and, in response to said determining, control the memory refresh circuit to enable said refresh of all memory resources of the dynamic random access memory.

In an embodiment, the active state comprises a state where the radio modem is operating a radio connection.

In an embodiment, the memory resources of the dynamic random access memory are divided into a plurality of memory blocks, wherein the memory allocator is configured to allocate the memory resources in units of said memory blocks, and wherein the memory refresh circuit performs, under the control of the controller, the disabling in units of said memory blocks such that, if a memory block has not been allocated during the idle state by the memory allocator, the refresh is disabled for all memory resources of the memory block.

In an embodiment, the memory refresh circuit controls the refreshing in units of memory refresh blocks, wherein each memory refresh block comprises a plurality of said memory blocks, and wherein the controller together with the memory refresh circuit disables the refreshing for a memory refresh block only if all memory blocks of the memory refresh block are unallocated.

In an embodiment, the controller causes, in response to determining that the radio modem is in the idle state, the memory allocator to determine the unallocated memory resources, including memory resources released by the radio modem upon entering the idle state, and the memory refresh circuit to disable said refresh of the determined unallocated memory resources.

In an embodiment, the radio device further comprises an application processor configured to communicate with the memory allocator in order to gain memory resources from the dynamic random access memory circuit, and wherein the controller controls the memory refresh circuit to disable said refresh of the unallocated memory resources when the application processor is in an active state and has allocated memory resources in the dynamic random access memory circuit.

According to an aspect, there is provided a computer program product embodied on a distribution medium readable by a computer and comprising computer program instructions that, when executed by the computer for a radio device, cause the computer to carry out a computer process comprising: determining, on the basis of a state change signal received from a radio modem of the radio device, that the radio device is in an idle state; and in response to said determining, controlling a memory refresh circuit of the radio device, configured to refresh memory resources of a dynamic random access memory circuit of the radio device, to disable said refresh of unallocated memory resources of the dynamic random access memory circuit.

BRIEF DESCRIPTION OF DRAWINGS

In the following, example embodiments will be described in greater detail with reference to the attached drawings, in which.

DETAILED DESCRIPTION OF SOME EMBODIMENTS

The following embodiments are examples. Although the specification may refer to "an", "one", or "some" embodiment(s) in several locations, this does not necessarily mean that each such reference is to the same embodiment(s), or that the feature only applies to a single embodiment. Single features of different embodiments may also be combined to provide other embodiments. Furthermore, words "comprising" and "including" should be understood as not limiting the described embodiments to consist of only those features that have been mentioned and such embodiments may contain also features/structures that have not been specifically mentioned.

Figure 1:
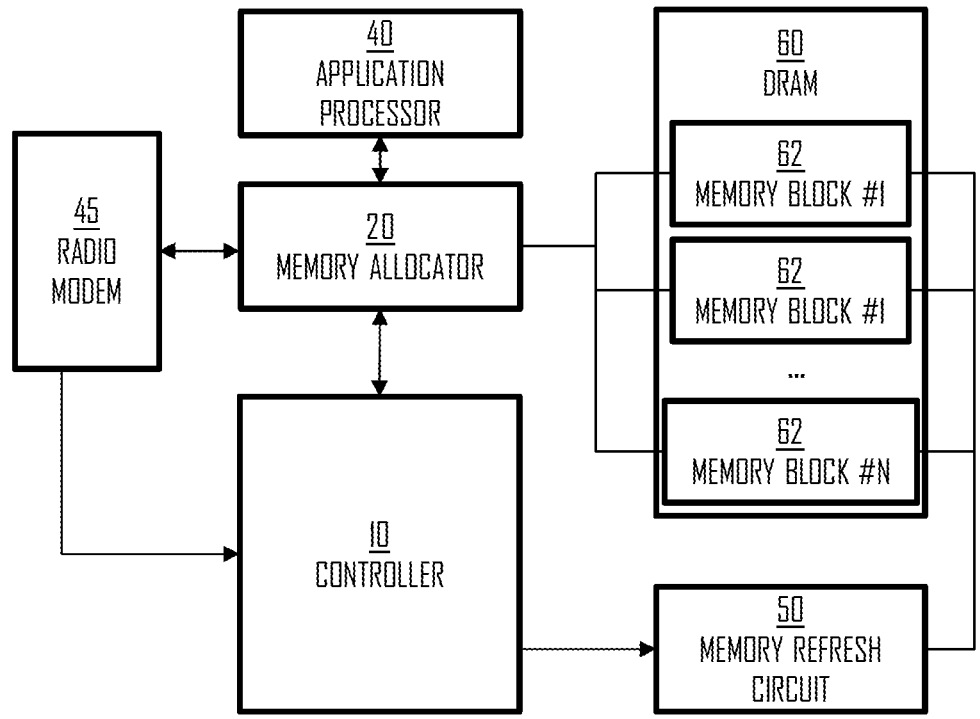
FIG. 1 illustrates an apparatus according to an embodiment.

FIG. 1 illustrates an apparatus according to an embodiment. The apparatus may be for a radio device such as user equipment (UE) of a cellular communication system, a terminal device or a peer device of a radio network, or any radio device comprising a radio communication circuitry configured with radio communication capability. Embodiments described herein are not limited to any particular radio communication protocol but is equally applicable to cellular communication protocols such as Long-Term Evolution (LTE) or 5G according to 3GPP (Third Generation Partnership Project) standards, wireless local area network protocols such as IEEE 802.11-based protocols, and to short range radio protocols such as IEEE 802.15-based protocols. The embodiments are also applicable to proprietary protocols as well as trunked radio systems.

The apparatus may comprise a radio modem 45 supporting one or more radio communication protocols. The radio modem may carry out baseband functions according to the supported protocols, e.g. data modulation and demodulation, coding and decoding, and generation and extraction of signaling messages. Additionally, the apparatus may include radio frequency components configured to convert a transmission signal output from the radio modem 45 to a radio frequency and transmit the transmission signal via one or more antennas. On the other hand, the radio frequency components may be configured to received reception signals via the one or more antennas and convert them to baseband and output the baseband signals to the radio modem. The radio modem may operate in various states or modes, including an active state and an idle state. As an example of the idle state, several protocols define a power-save mode where the radio modem may shut down certain functions in order to save power. Such a power-save mode may be applied during a radio connection established by the radio modem with at least one other radio device, e.g. a base station, access point, or a peer radio device. Examples of such a power-save mode include a power-save mode of 802.11 standard and radio resource control (RRC) Connected Inactive state. Another example of the idle state is a state where the radio modem has no radio connection established. For example, LTE and 5G protocols define an RRC Idle state as such an idle state. As examples of the active state, RRC Connected and an active mode in power management modes of 802.11 specifications.

The apparatus may further comprise a dynamic random access memory (DRAM) 60 comprising memory resources that are used as a work memory. The DRAM may be realized as a memory chip or memory circuit. The DRAM 60 may include multiple memory chips or circuits. As mentioned in Background, the DRAM may be understood as a memory that requires refreshing to maintain the data stored therein and, for that purpose, the apparatus may comprise a memory refresh circuit 50 configured to refresh the memory resources of the DRAM. The refreshing may be carried out by reading and rewriting the memory resources periodically or otherwise in a regular manner. Other methods of applying refreshing current to memory cells of the DRAM may be used.

The apparatus may further comprise a memory allocator 20 configured to allocate memory resources from the DRAM to one or more processors requesting for the work memory. The memory allocator may store information enabling the allocation, e.g. determining unallocated memory resources. The information may be stored in the form of a data structure indicating the unallocated memory resources. Such a data structure may be called a free list. The DRAM may be a block RAM or a distributed RAM and, as known in the art, the difference is in how the memory structure is organized, e.g. in terms of the size of allocatable memory units.

The apparatus may further comprise an application processor 40 configured to generate and process data transferred via the radio modem. Depending on the primary purpose of the apparatus, the application processor may execute various applications or functions that generate and consume data transferred via the radio modem 45. For example, if the apparatus of for a sensor device, the application processor may process measurement data measured by one or more sensors of the apparatus and transfer the measurement data via the radio modem. If the apparatus is a user device such as a cellular phone, the application processor may execute various user applications conventionally stored and executed in the user devices, e.g. an Internet browsed, an e-mail application, a calendar application, a video streaming application, and a gaming application. Such application may require transfer of data via the radio modem 45.

The application processor 40 and/or the radio modem 45 may communicate with the memory allocator 20 for gaining the memory resources from the DRAM 60, and the memory allocator may allocate the memory resources according to the requests.

Figure 2:
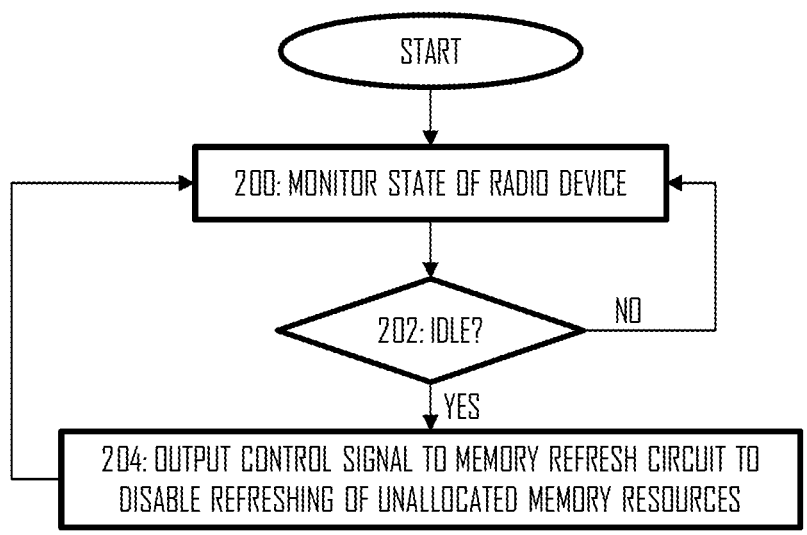
FIG. 2 illustrates a process for controlling memory refreshing according to an embodiment.

The apparatus further comprises control means in the form of a controller circuit 10 configured to control the memory refreshing according to the state of the radio device, e.g. the radio modem. Upon determining that the radio device is in an idle state, the controller controls the memory refresh circuit 50 to disable the refresh of the unallocated memory resources of the DRAM 60. FIG. 2 illustrates an embodiment of a computer process executed by the controller 10.

Referring to FIG. 2, the process comprises monitoring (block 200) a state of the radio device, e.g. the state of the radio modem. In block 202, it is determined whether or not the radio device is in an idle state. If the radio device is detected not to be in the idle state, the process may return to block 200. If the radio device is detected to be in the idle state, the process may proceed to block 204 where the controller outputs a control signal to the memory refresh circuit to disable refreshing of unallocated memory resources of the DRAM. The controller or the memory refresh circuit may retrieve the information on the unallocated memory resources from the memory allocator 20. In response to the control signal, the memory refresh circuit 50 may disable the refreshing of the unallocated memory resources.

A technical effect provided by the process is that the refreshing of unused memory resources is disabled, thus providing power-savings and reducing power consumption. This is particularly advantageous in battery-powered radio devices.

In an embodiment, controller is configured to control the memory refresh circuit to disable said refresh of the unallocated memory resources when the application processor is in an active state and has allocated memory resources in the dynamic random access memory circuit. Accordingly, the improved power savings may be realized even in a state where the application processor is operating and accesses memory resources allocated to it.

In an embodiment, upon detecting that the radio device is not in the idle state, e.g. is in the active state, the controller may output a control signal to the memory refresh circuit 50 to enable the refreshing of all memory resources of the DRAM. The controller may output the control signal only in connection with a state change of the radio device. From that perspective, the process of FIG. 2 may be understood such that, upon detecting the idle state in block 202, the controller may output the control signal instructing the disabling only if the disabling is not yet in effect. In the same manner, upon detecting the active state in block 202, the controller may output the control signal instructing the enabling only if the enabling is not yet in effect. In practice, block 200 may be carried out by polling the state of the radio device, or by standing by for a state change signal from the radio device. In other words, the controller 10 determines, on the basis of the state change signal received from the radio device, e.g. the radio modem, that the radio device is in the idle state and, as a consequence, disables the refreshing of the unallocated memory resources. A further embodiment related to signaling the state change is described below in connection with FIG. 7.

The memory refresh circuit may thus operate in at least two modes: a first mode where the refreshing is performed for all memory resources of the DRAM(s) and a second mode where the refreshing is disabled for the unallocated memory resources. The controller 10 may control the transition between the first mode and second mode in the above-described manner.

The idle state and the active state may be defined as described above. In an embodiment, the idle state comprises a radio resource connection idle mode where the radio device has no radio connection with an access node of a cellular communication system. An example of such an idle state is a radio resource connection idle (RRC_IDLE) state known in connection with cellular communication systems. Another similar idle state falling into the meaning of the idle state herein is an idle state where the radio device may have a radio (RRC) connection but no non-access stratum (NAS) connection with a cellular network. In an embodiment, the idle state comprises a power-save mode of a radio connection, such as connected mode discontinuous reception (DRX) known in connection with cellular communication systems. In an embodiment, the active state comprises a state where the radio device is operating a radio connection, e.g. transferring data or signaling information over the radio connection and accesses allocated memory resources.

Figure 3:
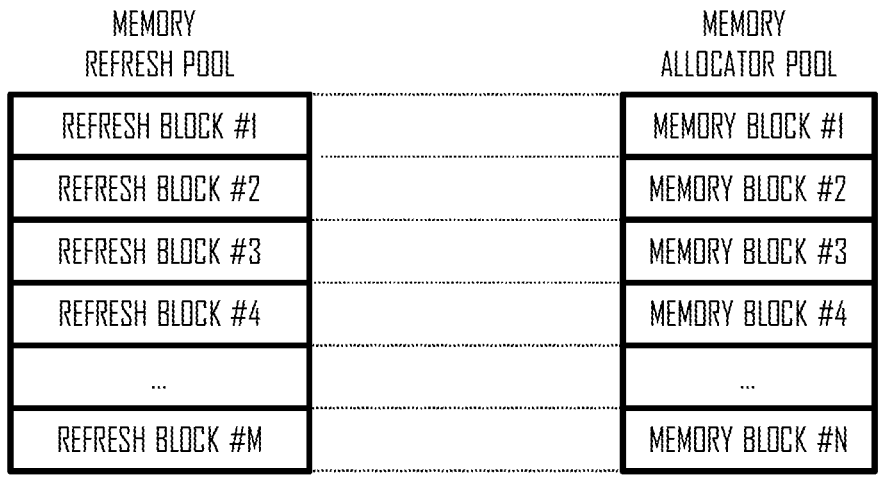
FIG. 3 illustrates an embodiment of a memory structure.

Let us then describe some embodiments of the process of FIG. 2. As FIG. 3 illustrates, the physical DRAM circuit 60 may be logically divided in two separate ways: one from the perspective of the memory allocator and the other from the perspective of the memory refresh circuit. The memory resources of the DRAM may be divided into a plurality of memory blocks (#1 to #N in FIG. 3), and the memory allocator may be configured to allocate the memory resources in units of said memory blocks. For example, if the radio modem or the application processor requests for amount X of memory resources, the memory allocator may determine X in units of memory blocks and allocate a sufficient number of memory blocks to the requesting entity. Each memory block may comprise a determined number of bits or bytes, wherein the number is defined by the hardware configuration of the DRAM. The DRAM circuit may further be divided into refresh blocks (#1 to #M in FIG. 3), and the memory refresh circuit may be configured to, under the control of the controller, to carry out the refreshing in units of said refresh blocks. The memory refresh circuit may thus have capability of scaling the refreshing with the granularity of the refresh blocks. Each refresh block may cover a determined number of (more than one) memory units, e.g. memory cells. The memory refresh circuit may be capable of determining for each refresh block whether to enable or disable the refreshing, and the enabling or disabling is then carried out for all memory cells of the refresh block.

Figure 4:
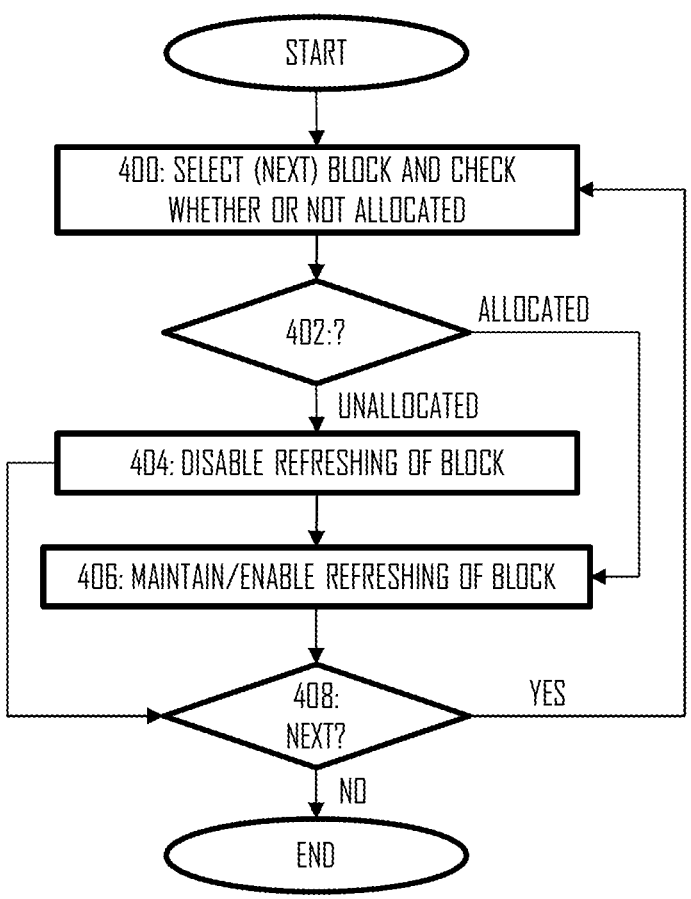
FIG. 4 illustrates an embodiment of a process for controlling memory refreshing for the memory structure of FIG. 3.

Now, depending on the relation between the two logical divisions of the DRAM, the procedure of FIG. 2 may be carried out according to separate embodiments. FIGS. 3 to 6 relate to embodiments where the DRAM is the block RAM. A block RAM may be understood as RAM where the memory resources are divided into memory blocks, and each memory block comprises a plurality of memory cells. Common sizes of the memory blocks are 4, 8, 16, and 32 kilobits, although other blocks sizes are equally possible. FIG. 3 illustrates an embodiment where the refresh block and the memory block are of the same size (M=N) and follow the same division logic, e.g. the refresh blocks #1 to #M comprise the same memory cells as the respective memory blocks #1 to #N. FIG. 4 illustrates an embodiment of block 204 for the memory structure of FIG. 3, when the procedure is performed by the controller. In another embodiment, the procedure of FIG. 4 is performed by the memory refresh circuit and, accordingly, FIG. 4 is an embodiment of FIG. 2 and comprises steps performed after block 204.

Referring to FIG. 4, upon triggering block 204 the process may proceed to blocks 400 to 408 where the memory/refresh blocks are checked and refresh of unallocated memory resources is disabled. Now that the memory blocks and refresh blocks are divided according to the same logic, a memory block equals to the refresh block. In block 400, a memory/refresh block is selected and in block 402 it is determine whether the memory block has been allocated to the processor or the radio modem. If the memory block is not in the free list, i.e. is allocated, the process proceeds to block 406 where the refresh of the memory block is enabled or maintained. On the other hand, if the memory block is unallocated, e.g. in the free list, the process proceeds from block 402 to block 404 where the refreshing is disabled for the memory block. From block 404 and 406, the process proceeds to block 408 where it is determined whether or not to select the next memory/refresh block. If all the memory/refresh blocks (in the free list) have been scanned, the process may end. Otherwise, the process may continue by the selection of the next memory/refresh block in block 400. In this manner, the process may continue until refreshing of all the unallocated memory/refresh blocks has been disabled.

Figure 5:
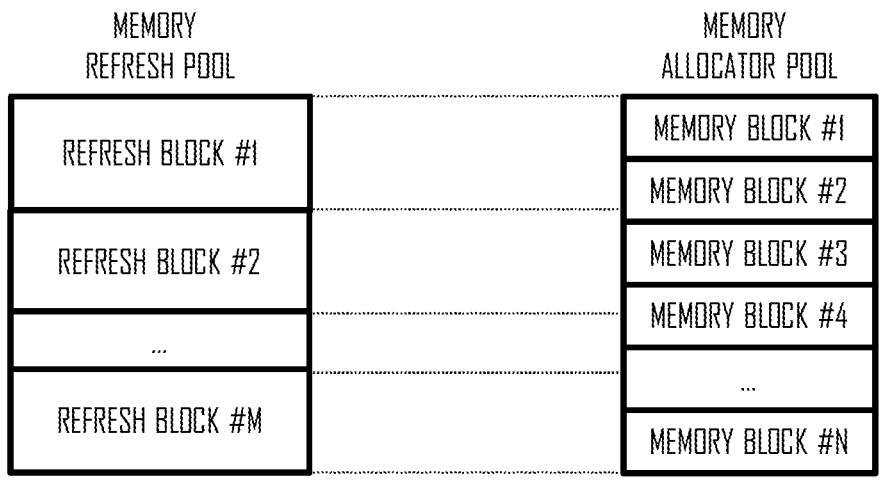
FIG. 5 illustrates an embodiment of another memory structure.
Figure 6:
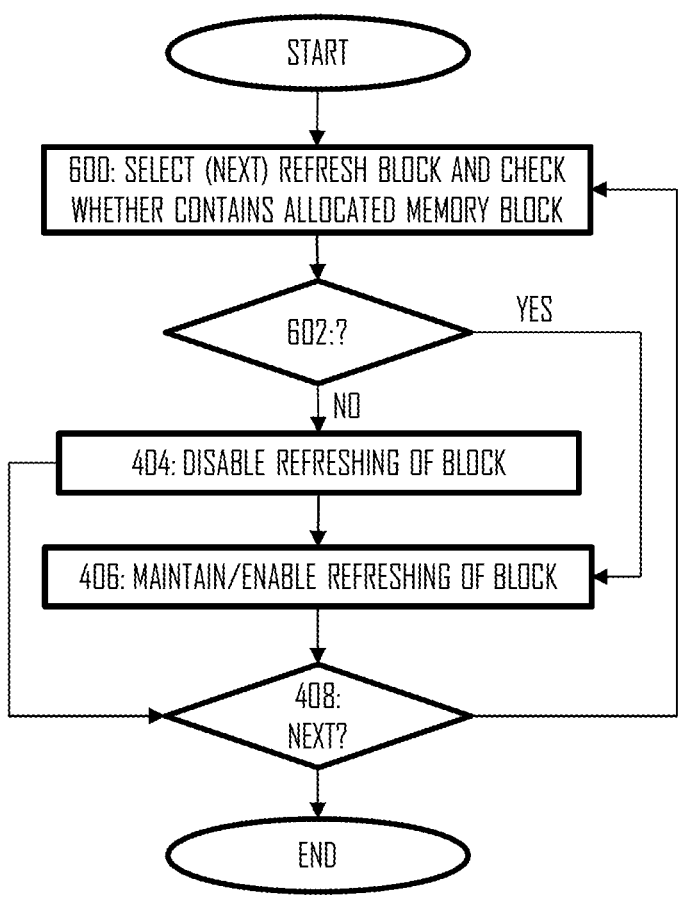
FIG. 6 illustrates an embodiment of a process for controlling memory refreshing for the memory structure of FIG. 5.

FIG. 5 illustrates an embodiment where the refresh block and the memory block are of different sizes (M≠N). Accordingly, refresh blocks #1 to #M comprise at least partially different memory cells than the respective memory blocks #1 to #N. Depending on whether M>N or M<N, each refresh block may include memory cells from a plurality of memory blocks (M<N) or each memory block may include memory cells from a plurality of refresh blocks (M>N). FIG. 5 illustrates an embodiment where M<N. Now, the disabling logic may follow a principle that a refresh block shall be disabled in the idle state of the radio device only if the refresh block contains no allocated memory blocks. If there is at least one memory cell in the refresh block that is included in an allocated memory block, the refreshing shall be maintained or enabled. FIG. 6 illustrates an embodiment of a process for carrying out the disabling. As described above in connection with FIG. 4, the procedure may be carried out by the controller or the memory refresh circuit, depending on the implementation. In FIG. 6, the blocks denoted by the same reference number as in FIG. 4 denote the same or substantially similar operations.

Referring to FIG. 6, the process may run through the refresh blocks and perform the disabling according to the above-described principle. In block 600, a refresh block is selected and it is checked whether or not the refresh block contains at least one allocated memory block. In block 602, a decision is made on the basis of the check. If there is at least one memory block that has been allocated, the process proceeds to block 406 where the refreshing is enabled or maintained. If there is not an allocated memory block in the refresh block, the process proceeds to block 404 where the refreshing is disabled, thus providing power-savings. From blocks 404 and 406, the process proceeds to block 408 for the selection of the next refresh block or for ending the process.

In the embodiment where M>N, the process may be carried out in the same or slightly different manner as in FIG. 6. Although multiple refresh blocks may have the memory cells of the same memory block, at least some refresh blocks may still have memory cells from multiple (e.g. two) memory blocks. Therefore, the same checks may be made. In a case where each refresh block has memory cells of a single memory block, the process simplifies in block 600 such that the check is made whether or not the memory block linked to the selected refresh block is allocated.

Figure 7:
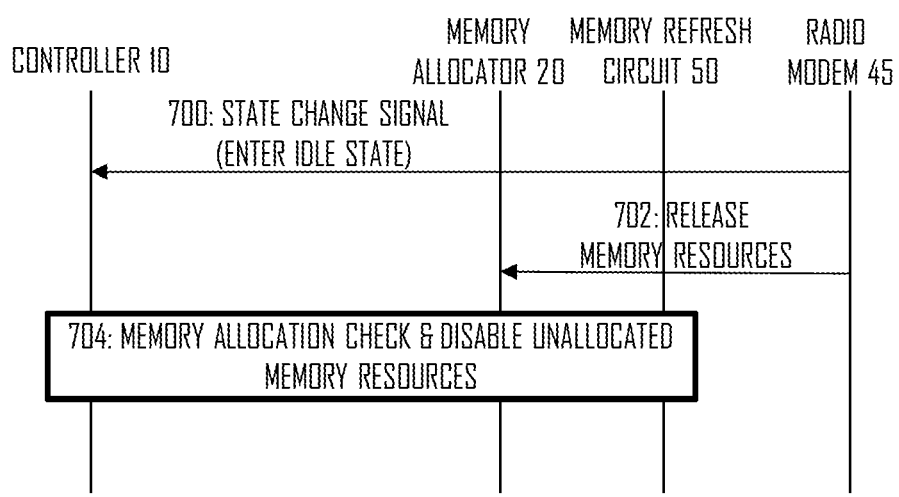
FIG. 7 illustrates an embodiment of a signaling diagram for signaling an idle state and associated triggering of disabled memory refreshing.

As described above, the disabling of the memory refreshing for unallocated memory resources may be triggered by the radio modem 45 indicating with the state change signal that it enters the idle state. FIG. 7 illustrates such signaling and associated disabling of the memory refreshing. Referring to FIG. 7, the radio modem 45 determines to enter the idle state and, as a consequence, outputs the state change signal indicating entering the idle state to the controller 10 in step 700. Furthermore, the radio modem may release memory resources allocated to it in step 702 by outputting a corresponding release signal to the memory allocator. In response to receiving the state change signal in step 700, the controller 10, together with the memory allocator determines the unallocated memory resources, including memory resources released by the radio modem upon entering the idle state, and controls the memory refresh circuit to disable said refresh of the determined unallocated memory resources (block 704). Block 704 may comprise the process of FIG. 4 or FIG. 6, for example.

The disabling of refreshing according to the embodiments described above may be carried out in the active mode as well. However, the advantage in terms of reduction in power consumption may be smaller, particularly if most of the memory resources are allocated.

The degree of reduction in the power consumption may correlate with the size of the refresh blocks with respect to the size of the memory blocks. In typical implementations, M<N which means that the size of the refresh block is greater than the size of the memory block in terms of a number of memory cells. The smaller is the size of the refresh block, the greater power savings can be achieved.

With respect to the controller 10 performing the process of FIG. 2, the controller may be understood as a processing circuitry comprising at least one processor and at least one memory comprising a computer program code readable by the at least one processor. The computer program code may form a computer program product defining a computer process executed by the at least one processor, when the at least one processor reads and executes the computer program code. The controller may be comprised in an apparatus for a radio device comprising the radio modem 45. The apparatus may be an electronic device.

As used in this application, the term 'circuitry' refers to one or more of the following: hardware-only circuit implementations such as implementations in only analogue and/or digital circuitry; combinations of hardware circuits and software and/or firmware; and circuits such as a microprocessor(s) or a portion of a microprocessor(s) that require software or firmware for operation, even if the software or firmware is not physically present. This definition of 'circuitry' applies to uses of this term in this application. As a further example, as used in this application, the term "circuitry" would also cover an implementation of merely a processor (or multiple processors) or portion of a processor, e.g. one core of a multi-core processor, and accompanying software and/or firmware. The term "circuitry" would also cover, for example and if applicable to the particular element, a baseband integrated circuit, an application-specific integrated circuit (ASIC), and/or a field-programmable grid array (FPGA) circuit for the apparatus according to an embodiment of the invention.

The processes or methods described in FIG. 2 or any of the embodiments thereof may also be carried out in the form of one or more computer processes defined by one or more computer programs. The computer program(s) may be in source code form, object code form, or in some intermediate form, and it may be stored in a carrier or a distribution medium, which may be any entity or device capable of carrying the program. Such carriers include transitory and/or non-transitory computer media, e.g. a record medium, computer memory, read-only memory, electrical carrier signal, telecommunications signal, and software distribution package. Depending on the processing power needed, the computer program may be executed in a single electronic digital processing unit or it may be distributed amongst a number of processing units.

Embodiments described herein are applicable to radio devices defined above but also to other implementations. The specifications of the radio devices, in particular radio protocols, memory structures etc. develop rapidly. Such development may require changes to the described embodiments. Therefore, all words and expressions should be interpreted broadly and they are intended to illustrate, not to restrict, the embodiment. It will be obvious to a person skilled in the art that, as technology advances, the inventive concept can be implemented in various ways. Embodiments are not limited to the examples described above but may vary within the scope of the claims.

The invention claimed is:

1. An apparatus for a radio device, comprising:
a dynamic random access memory circuit;
a memory allocator configured to allocate memory resources from the dynamic random access memory circuit and to determine unallocated memory resources;
a memory refresh circuit configured to refresh the memory resources of the dynamic random access memory circuit;
a radio modem configured to communicate with the memory allocator in order to gain memory resources from the dynamic random access memory circuit;
an application processor configured to communicate with the memory allocator in order to gain memory resources from the dynamic random access memory circuit; and
a controller configured to determine, on the basis of a state change signal received from the radio modem, that the radio modem is in an idle state and, in response to said determining, to control the memory refresh circuit to disable said refresh for the unallocated memory resources; and
control the memory refresh circuit to disable said refresh of the unallocated memory resources when the application processor is in an active state and has allocated memory resources in the dynamic random access memory circuit.

2. The apparatus of claim 1, wherein the idle state comprises a radio resource connection idle mode where the radio modem has no radio connection with an access node of a cellular communication system.

3. The apparatus of claim 1, wherein the idle state comprises a power-save mode of a radio connection.

4. The apparatus of claim 1, wherein the controller is further configured to determine that the radio modem is in an active state and, in response to said determining, to control the memory refresh circuit to enable said refresh of all memory resources of the dynamic random access memory.

5. The apparatus of claim 4, wherein the active state of the radio modem comprises a state where the radio modem is operating a radio connection.

6. The apparatus of claim 1, wherein the memory resources of the dynamic random access memory are divided into a plurality of memory blocks, wherein the memory allocator is configured to allocate the memory resources in units of said memory blocks, and wherein the memory refresh circuit is configured to, under the control of the controller, to perform the disabling in units of said memory blocks such that, if a memory block has not been allocated during the idle state by the memory allocator, the refresh is disabled for all memory resources of the memory block.

7. The apparatus of claim 6, wherein the memory refresh circuit is configured to control the refreshing in units of memory refresh blocks, wherein each memory refresh block comprises a plurality of said memory blocks, and wherein the controller together with the memory refresh circuit is configured to disable the refreshing for a memory refresh block only if all memory blocks of the memory refresh block are unallocated.

8. The apparatus of claim 1, wherein the controller is further configured, in response to determining that the radio modem is in the idle state, to cause the memory allocator to determine the unallocated memory resources, including memory resources released by the radio modem upon entering the idle state, and the memory refresh circuit to disable said refresh of the determined unallocated memory resources.

9. A method for a radio device, the radio device comprising:
  a dynamic random access memory circuit;
  a memory allocator configured to allocate memory resources from the dynamic random access memory circuit and to determine unallocated memory resources;
  a radio modem configured to communicate with the memory allocator in order to gain memory resources from the dynamic random access memory circuit; and
  a memory refresh circuit configured to refresh the memory resources of the dynamic random access memory circuit,
  wherein the method comprises:
  determining, by a controller on the basis of a state change signal received from the radio modem, that the radio modem is in an idle state; and
  in response to said determining, controlling by the controller the memory refresh circuit to disable said refresh for the unallocated memory resources; and
  controlling, by the controller, the memory refresh circuit to disable said refresh of the unallocated memory resources when the application processor is in an active state and has allocated memory resources in the dynamic random access memory circuit.

10. The method of claim 9, wherein the idle state comprises a radio resource connection idle mode where the radio modem has no radio connection with an access node of a cellular communication system.

11. The method of claim 9, wherein the idle state comprises a power-save mode of a radio connection of the radio modem.

12. The method of claim 9, wherein the controller further determines that the radio modem is in an active state and, in response to said determining, control the memory refresh circuit to enable said refresh of all memory resources of the dynamic random access memory.

13. The method of claim 12, wherein the active state of the radio modem comprises a state where the radio modem is operating a radio connection.

14. The method of claim 9, wherein the memory resources of the dynamic random access memory are divided into a plurality of memory blocks, wherein the memory allocator is configured to allocate the memory resources in units of said memory blocks, and wherein the memory refresh circuit performs, under the control of the controller, the disabling in units of said memory blocks such that, if a memory block has not been allocated during the idle state by the memory allocator, the refresh is disabled for all memory resources of the memory block.

15. The method of claim 14, wherein the memory refresh circuit controls the refreshing in units of memory refresh blocks, wherein each memory refresh block comprises a plurality of said memory blocks, and wherein the controller together with the memory refresh circuit disables the refreshing for a memory refresh block only if all memory blocks of the memory refresh block are unallocated.

16. The method of claim 9, wherein the controller causes, in response to determining that the radio modem is in the idle state, the memory allocator to determine the unallocated memory resources, including memory resources released by the radio modem upon entering the idle state, and the memory refresh circuit to disable said refresh of the determined unallocated memory resources.

17. A computer program product embodied on a non-transitory distribution medium readable by a computer and comprising computer program instructions that, when executed by the computer for a radio device, cause the computer to carry out a computer process comprising:
  determining, on the basis of a state change signal received from a radio modem of the radio device, that the radio modem is in an idle state; and
  in response to said determining, controlling a memory refresh circuit of the radio device, configured to refresh memory resources of a dynamic random access memory circuit of the radio device, to disable said refresh for unallocated memory resources of the dynamic random access memory circuit; and
  controlling the memory refresh circuit to disable said refresh of the unallocated memory resources when an application processor, configured to communicate with a memory allocator in order to gain memory resources from the dynamic random access memory circuit, is in an active state and has allocated memory resources in the dynamic random access memory circuit.

18. The computer program product of claim 17, wherein the idle state comprises a radio resource connection idle mode where the radio modem has no radio connection with an access node of a cellular communication system, or a power-save mode of a radio connection.

19. The computer program product of claim 17, wherein the memory resources of the dynamic random access memory are divided into a plurality of memory blocks, wherein the memory resources are allocated in units of said memory blocks, and wherein the memory refresh circuit is configured to perform the disabling in units of said memory blocks such that, if a memory block has not been allocated during the idle state, the refresh is disabled for all memory resources of the memory block.

20. The computer program product of claim 19, wherein the memory refresh circuit is configured to control the refreshing in units of memory refresh blocks, wherein each memory refresh block comprises a plurality of said memory blocks, and wherein the memory refresh circuit is configured to disable the refreshing for a memory refresh block only if all memory blocks of the memory refresh block are unallocated.

* * * * *